(12) United States Patent
Zhou et al.

(10) Patent No.: US 10,748,938 B2
(45) Date of Patent: Aug. 18, 2020

(54) ARRAY SUBSTRATE, METHOD OF MANUFACTURING THE SAME AND DISPLAY DEVICE

(71) Applicant: BOE Technology Group Co., Ltd., Beijing (CN)

(72) Inventors: Tianmin Zhou, Beijing (CN); Wei Yang, Beijing (CN); Lizhong Wang, Beijing (CN); Jipeng Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 11 days.

(21) Appl. No.: 16/134,201

(22) Filed: Sep. 18, 2018

(65) Prior Publication Data
US 2019/0096920 A1    Mar. 28, 2019

(30) Foreign Application Priority Data

Sep. 22, 2017  (CN) .......................... 2017 1 0867028

(51) Int. Cl.
*H01L 21/00* (2006.01)
*H01L 27/12* (2006.01)
(Continued)

(52) U.S. Cl.
CPC ........ *H01L 27/1225* (2013.01); *H01L 27/127* (2013.01); *H01L 27/1222* (2013.01); *H01L 27/1248* (2013.01); *H01L 27/1251* (2013.01); *H01L 27/1262* (2013.01); *H01L 27/1296* (2013.01); *H01L 21/3003* (2013.01);
(Continued)

(58) Field of Classification Search
CPC ............. H01L 27/1225; H01L 27/1222; H01L 27/1248
See application file for complete search history.

(56) References Cited

U.S. PATENT DOCUMENTS 9,246,007 B2 *  1/2016  Cheng ................. H01L 29/7869
9,985,082 B2 *  5/2018  Lee ..................... H01L 27/1222
(Continued)

FOREIGN PATENT DOCUMENTS

CN       106876412 A    6/2017
CN       207503977 U    6/2018
WO    WO-2019103920 A1 *  5/2019  ......... H04B 7/18513

OTHER PUBLICATIONS

First Office Action, including Search Report, for Chinese Patent Application No. 201710867028.9, dated Apr. 12, 2019, 11 pages.

*Primary Examiner* — Laura M Menz
(74) *Attorney, Agent, or Firm* — Westman, Champlin & Koehler, P.A.

(57) ABSTRACT an array substrate, a method of manufacturing the array substrate, and a display device are provided. The array substrate includes: a base substrate; a first thin film transistor and a second thin film transistor on the base substrate, wherein the first thin film transistor comprises a first active layer, the second thin film transistor comprises a second active layer, and the second active layer is on a side of the first active layer away from the base substrate; and an interlayer dielectric layer and a first buffer layer between the first active layer and the second active layer, wherein the interlayer dielectric layer is capable of supplying hydrogen and the first buffer layer is capable of blocking hydrogen.

11 Claims, 2 Drawing Sheets

(51) Int. Cl.
*H01L 21/30* (2006.01)
*H01L 29/786* (2006.01)

(52) U.S. Cl.
CPC .... *H01L 29/7869* (2013.01); *H01L 29/78609* (2013.01); *H01L 29/78675* (2013.01)

(56) References Cited

U.S. PATENT DOCUMENTS

| | | | |
|---|---|---|---|
| 10,388,710 B2* | 8/2019 | Lee | H01L 27/1251 |
| 10,453,965 B2* | 10/2019 | Yamaguchi | H01L 29/42384 |
| 10,475,824 B2* | 11/2019 | Ren | H01L 27/14685 |
| 10,490,669 B2* | 11/2019 | Ding | H01L 29/78618 |
| 2002/0102758 A1 | 8/2002 | Yonehara et al. | |
| 2011/0031497 A1* | 2/2011 | Yamazaki | H01L 27/1225 |
| | | | 257/59 |
| 2014/0110702 A1* | 4/2014 | Cheng | H01L 29/7869 |
| | | | 257/43 |
| 2014/0326990 A1* | 11/2014 | Wang | H01L 27/1225 |
| | | | 257/43 |
| 2018/0012947 A1* | 1/2018 | Lee | H01L 27/3272 |
| 2018/0076239 A1* | 3/2018 | Suzumura | H01L 27/1229 |
| 2018/0240855 A1* | 8/2018 | Lee | H01L 27/3262 |
| 2018/0286888 A1* | 10/2018 | Yamaguchi | H01L 27/1222 |
| 2019/0019813 A1* | 1/2019 | Ren | H01L 27/14616 |
| 2019/0027511 A1* | 1/2019 | Li | H01L 29/78606 |
| 2019/0067640 A1* | 2/2019 | Dong | H01L 51/5056 |
| 2019/0096920 A1* | 3/2019 | Zhou | H01L 27/1248 |
| 2019/0103420 A1* | 4/2019 | Liu | H01L 27/1225 |
| 2019/0123069 A1* | 4/2019 | Yang | H01L 27/1251 |
| 2019/0172953 A1* | 6/2019 | Ding | H01L 27/127 |
| 2019/0267409 A1* | 8/2019 | Hu | H01L 27/1251 |
| 2019/0386144 A1* | 12/2019 | Ding | H01L 29/78618 |
| 2020/0006568 A1* | 1/2020 | Yamaguchi | H01L 29/4966 |

* cited by examiner

ARRAY SUBSTRATE, METHOD OF MANUFACTURING THE SAME AND DISPLAY DEVICE

CROSS-REFERENCE TO RELATED APPLICATION

This application claims priority to Chinese Patent Application No. 201710867028.9 filed on Sep. 22, 2017 in the State Intellectual Property Office of China, the disclosure of which is hereby incorporated by reference in its entirety.

TECHNICAL FIELD

The present disclosure relates to the field of display technologies, and in particular, to an array substrate, a method of manufacturing the array substrate, and a display device.

BACKGROUND

The low-temperature polysilicon thin film transistor (abbreviated as LTPS-TFT) display device is widely used in the market due to its advantages such as high resolution, high brightness and high aperture ratio. The metal oxide thin film transistor is gradually widely used in the flat panel display due to its high carrier mobility and low cost.

SUMMARY

An embodiment of the present disclosure provides an array substrate, comprising: a base substrate; a first thin film transistor and a second thin film transistor on the base substrate, wherein the first thin film transistor comprises a first active layer, the second thin film transistor comprises a second active layer, and the second active layer is on a side of the first active layer away from the base substrate; and an interlayer dielectric layer and a first buffer layer between the first active layer and the second active layer, wherein the interlayer dielectric layer is capable of supplying hydrogen and the first buffer layer is capable of blocking hydrogen.

In some embodiments, the first active layer is a polysilicon active layer, the second active layer is an oxide semiconductor active layer, and the first buffer layer is on a side of the interlayer dielectric layer away from the base substrate.

In some embodiments, The array substrate further comprises a second buffer layer capable of supplying oxygen, the second buffer layer being between the first buffer layer and the oxide semiconductor active layer.

In some embodiments, the first thin film transistor comprises a first source electrode and a first drain electrode, and the second thin film transistor comprises a second source electrode and a second drain electrode, one of the first source electrode and the first drain electrode is electrically connected to one of the second source electrode and the second drain electrode.

In some embodiments, the first source electrode, the first drain electrode, the second source electrode, and the second drain electrode are all in the same layer and between the interlayer dielectric layer and the first buffer layer.

In some embodiments, the one of the first source electrode and the first drain electrode and the one of the second source electrode and the second drain electrode constitute a single unitary electrode.

In some embodiments, material of the first buffer layer comprises aluminum oxide, silicon nitride or organic material.

In some embodiments, material of the second buffer layer comprises silicon oxide.

In some embodiments, the first buffer layer has an oxygen content smaller than that of the second buffer layer, and the first buffer layer has a hydrogen content greater than that of the second buffer layer.

In some embodiments, the first thin film transistor comprises a first gate electrode, the second thin film transistor comprises a second gate electrode, and the first gate electrode and the second gate electrode are in the same layer and both between the polysilicon active layer and the interlayer dielectric layer.

In some embodiments, The array substrate further comprises a gate insulating layer between the polysilicon active layer and a gate electrode layer comprising the first gate electrode and the second gate electrode.

An embodiment of the present disclosure provides a method of manufacturing an array substrate, comprising: forming a polysilicon active layer of a first thin film transistor on a base substrate; forming an interlayer dielectric layer capable of supplying hydrogen on the base substrate on which the polysilicon active layer is formed, so that the interlayer dielectric layer covers the polysilicon active layer; forming a first buffer layer capable of blocking hydrogen on the base substrate on which the interlayer dielectric layer is formed; and forming an oxide semiconductor active layer of a second thin film transistor on the base substrate on which the first buffer layer is formed.

In some embodiments, after the step of forming the first buffer layer capable of blocking hydrogen on the base substrate on which the interlayer dielectric layer is formed, the method further comprises: forming a second buffer layer capable of supplying oxygen on the base substrate on which the first buffer layer is formed, wherein the oxide semiconductor active layer is formed on the second buffer layer.

In some embodiments, before the step of forming the oxide semiconductor active layer, the method further comprises: performing a surface treatment on the second buffer layer with plasma.

In some embodiments, before the step of forming the first buffer layer capable of blocking hydrogen on the base substrate on which the interlayer dielectric layer is formed, the method further comprises: forming a first source electrode and a first drain electrode of the first thin film transistor and a second source electrode and a second drain electrode of the second thin film transistor on the interlayer dielectric layer by one patterning process.

In some embodiments, before the step of forming the interlayer dielectric layer capable of supplying hydrogen on the base substrate on which the polysilicon active layer is formed, the method further comprises: forming a gate insulating layer covering the polysilicon active layer on the base substrate on which the polysilicon active layer is formed; and forming a first gate electrode of the first thin film transistor and a second gate electrode of the second thin film transistor on the gate insulating layer by one patterning process.

In some embodiments, material of the first buffer layer comprises aluminum oxide, silicon nitride or an organic material.

In some embodiments, material of the second buffer layer comprises silicon oxide.

An embodiment of the present disclosure provides a display device comprising the array substrate according the above embodiments.

DETAILED DESCRIPTION OF THE EMBODIMENTS

Figure 1:
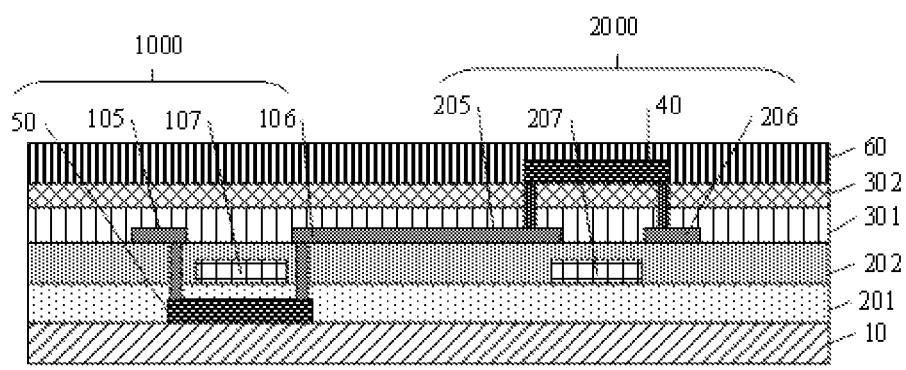
FIG. 1 is a schematic cross-sectional view of an array substrate according to an embodiment of the present disclosure.

The present disclosure is further described with reference to the drawings and exemplary embodiments, the same reference numerals in the drawings refer to the same or like parts. Further, a detailed description of a known technology will be omitted if it is not necessary to show the features of the present disclosure.

In the related art, a low-temperature polysilicon (LTPS) thin film transistor includes an active layer formed of low-temperature polysilicon. A carrier mobility of the active layer is too large, resulting in a high leakage current and high power consumption under low frequency driving. In order to display gray scales well, it is necessary to provide a large channel length for the thin film transistor (TFT), so that it is difficult to achieve high PPI (Pixels Per Inch). The thin film transistor with low-temperature polysilicon as the active layer further has a high hysteresis, which easily causes residual images.

Oxides such as metal oxides are used as a new semiconductor active layer material due to their advantages of high carrier mobility and low cost, however, the threshold voltage of the thin film transistor with the metal oxides as the active layer is not stable and the metal oxides are sensitive to external environment.

In summary, the low-temperature polysilicon thin film transistor and the metal oxide thin film transistor have their own advantages and disadvantages, and both have room for improvement.

In embodiments of the present disclosure, the inventors combine the low-temperature polysilicon thin film transistor with the metal oxide thin film transistor. In this way, the metal oxide thin film transistor may compensate for the disadvantages, such as large leakage currents, of the low-temperature polysilicon (LTPS) thin film transistor, and the low-temperature polysilicon (LTPS) thin film transistor may compensate for the disadvantages such as instable threshold voltage of the metal oxide thin film transistor. However, the inventors have found in practice that there are many process difficulties if the low-temperature polysilicon (LTPS) thin film transistor and the metal oxide thin film transistor are manufactured on the same substrate. For example, it is important to implement a hydrogen supplementation process for the low-temperature polysilicon (LTPS). It is necessary to implement the hydrogen supplementation process for the polysilicon active layer to reduce dangling bonds, thereby increasing the stability of the polysilicon (P-Si) while reducing the leakage current ($I_{off}$). However, hydrogen supplementation by high temperature diffusion causes hydrogen ions ($H^+$) to diffuse in various directions, which causes free hydrogen ions ($H^+$) to act on the metal oxide semiconductor active layer of the metal oxide thin film transistor. The hydrogen ions ($H^+$) may rob the oxygen in the metal oxide, which causes a large amount of oxygen defects in the metal oxide, so that the metal oxide semiconductor active layer may be conductive, thereby causing a short circuit between a source electrode and a drain electrode of the metal oxide thin film transistor.

In order to solve at least one of the above problems, an embodiment of the present disclosure provides an array substrate. The array substrate includes a base substrate, a first thin film transistor and a second thin film transistor disposed on the base substrate. The first thin film transistor includes a first active layer, and the second thin film transistor includes a second active layer. The second active layer is disposed on a side of the first active layer away from the base substrate. The array substrate further includes an interlayer dielectric layer and a first buffer layer sequentially stacked on the base substrate and disposed between the first active layer and the second active layer. The interlayer dielectric layer is capable of supplying hydrogen, and the first buffer layer capable of blocking hydrogen.

FIG. 1 is a schematic cross-sectional view of an array substrate according to an embodiment of the present disclosure. As shown in FIG. 1, an embodiment of the present disclosure provides an array substrate. The array substrate includes: a base substrate 10, a first thin film transistor 1000 and a second thin film transistor 2000 disposed on the base substrate 10. The first thin film transistor 1000 is a low-temperature polysilicon thin film transistor and includes a polysilicon active layer 50. The second thin film transistor 2000 is a metal oxide thin film transistor and includes a metal oxide semiconductor active layer 40. The metal oxide semiconductor active layer 40 is disposed on a side of the polysilicon active layer 50 away from the base substrate 10. The array substrate further includes an interlayer dielectric layer 202 (abbreviated as ILD) capable of supplying hydrogen and a first buffer layer 301 capable of blocking hydrogen. The interlayer dielectric layer 202 and the first buffer layer 301 are both disposed between the polysilicon active layer 50 and the metal oxide semiconductor active layer 40. The interlayer dielectric layer 202 is located between the polysilicon active layer 50 and the first buffer layer 301, and the first buffer layer 301 is located between the interlayer dielectric layer 202 and the metal oxide semiconductor active layer 40.

The second thin film transistor 2000 is a metal oxide thin film transistor, and the metal oxide semiconductor active layer may be formed of indium gallium zinc oxide (IGZO). In other embodiments, the metal oxide semiconductor active layer may also be formed of at least one of zinc oxide (ZnO), indium oxide (InO) and gallium oxide (GaO).

The second thin film transistor 2000 further includes a lead wire for connecting a source electrode and/or a drain electrode of the second thin film transistor to the metal oxide semiconductor active layer 40 of the second thin film transistor. The lead wire penetrates the first buffer layer 301 so as to connect the source electrode and/or the drain electrode of the second thin film transistor to the metal oxide semiconductor active layer 40 of the second thin film transistor. The material of the lead wire may be the same as the material of the metal oxide semiconductor active layer 40. The lead wire may be manufactured in the same patterning process as the metal oxide semiconductor active layer 40, so that the lead wire and the metal oxide semiconductor active layer 40 are formed integrally. Optionally, the lead wire and the metal oxide semiconductor active layer 40 may be separately manufactured.

The base substrate 10 is a plastic substrate or a glass substrate. In this embodiment, a plastic substrate may be used. The plastic substrate is flexible and easy to bend, and the cost is low.

The interlayer dielectric layer 202 is used to supply hydrogen ions for a hydrogenation treatment on the polysilicon active layer 50. The hydrogenation treatment utilizes abundant ions in the interlayer dielectric layer 202 to fill dangling bonds of silicon atoms in polysilicon so as to reduce quantity of unsteady dangling bonds and improve the stability of the polysilicon, thereby improving the electron mobility, conductivity characteristics and threshold voltage uniformity of a polysilicon semiconductor layer.

As shown in FIG. 1, the array substrate may further include a gate insulating layer 201 disposed on the polysilicon active layer 50. The gate insulating layer 201 (abbreviated as GI) is located between the polysilicon active layer 50 and the interlayer dielectric layer 202 (ILD), the interlayer dielectric layer 202 (ILD) has a function of supplying hydrogen.

The interlayer dielectric layer 202 has a greater hydrogen content than an adjacent layer such as the gate insulating layer 201, and is suitable as a hydrogen supply layer to the polysilicon active layer 50. The interlayer dielectric layer 202 (ILD) may be made of silicon nitride ($SiN_x$) having a great hydrogen content, which may be formed by a reaction of silane ($SiH_4$), ammonia gas ($NH_3$) and nitrogen gas ($N_2$) and may have the hydrogen ($H^+$) content of about 25-35 at. %.

The hydrogen ($H^+$) content in the interlayer dielectric layer 202 (ILD) is mainly measured by measuring a total content of S—H and N—H in a silicon nitride ($SiN_x$) film by spectroscopic analysis (abbreviated as FTIR). It is generally calculated that the total content of S—H and N—H in the interlayer dielectric layer 202 (ILD) is about 25-35 at. %. The gate insulating layer 201 (GI) adjacent to the interlayer dielectric layer 202 is made of silicon oxide ($SiO_x$), and a hydrogen ($H^+$) content of the gate insulating layer 201 (GI) is usually below 6 at. %.

The first buffer layer 301 may block hydrogen and may block hydrogen ions in the interlayer dielectric layer 202 (ILD) from diffusing through the first buffer layer 301 to the metal oxide semiconductor active layer 40.

If the first buffer layer 301 is absent, hydrogen from the interlayer dielectric layer 202 (ILD) having a function of supplying hydrogen may also diffuse toward the metal oxide semiconductor active layer 40 during the hydrogen supplementation into the polysilicon active layer 50. As a result, the free hydrogen ions ($H^+$) may rob the oxygen in the metal oxide, which causes a large amount of oxygen defects in the metal oxide, so that the metal oxide semiconductor active layer may be conductive, thereby causing a short circuit between the source electrode and the drain electrode of the metal oxide thin film transistor.

The polysilicon active layer 50 and the metal oxide semiconductor active layer 40 are disposed on both sides of the first buffer layer 301 capable of blocking hydrogen so as to avoid the metal oxide semiconductor active layer 40 forming on the interlayer dielectric layer 202 directly. In this way, the problem of short-circuit between the source electrode and the drain electrode of the metal oxide thin film transistor may be effectively solved.

The source electrode and the drain electrode of the first thin film transistor 1000 and the source electrode and the drain electrode of the second thin film transistor 2000 provided by the embodiment of the present disclosure are manufactured by one patterning process with one mask. Generally, one patterning process employs one mask.

The first thin film transistor 1000 and the second thin film transistor 2000 are formed on the same base substrate 10. The source electrodes and the drain electrodes of the two thin film transistors are manufactured by the same patterning process. Specifically, a first source electrode 105 and a first drain electrode 106 of the first thin film transistor 1000 105 and a second source electrode 205 and a second drain electrode 206 of the second thin film transistor 2000 are formed by one patterning process, and the source electrodes and the drain electrodes of the two thin film transistors are made of the same material, thereby reducing quantity of mask during the manufacture of the array substrate and simplifying the manufacture process.

In an embodiment, the first drain electrode 106 of the first thin film transistor 1000 and the second source electrode 205 of the second thin film transistor 2000 are directly connected together and constitute a single unitary electrode. Since the source electrode and the drain electrode of the thin film transistor are interchangeable, in other embodiments, one of the first source electrode and the first drain electrode of the first thin film transistor and one of the second source electrode and the second drain electrode of the second thin film transistor are directly connected together and constitute a single unitary electrode.

The source electrodes and the drain electrodes of the two thin film transistors are made of the same material, and one of the source electrode and the drain electrode of one thin film transistor is integrated with one of the source electrode and the drain electrode of the other thin film transistor, thereby saving the lead wire material and simplifying the manufacture process of the array substrate.

As shown in FIG. 1, in an embodiment of the present disclosure, a first gate electrode 107 of the first thin film transistor 1000 and a second gate electrode 207 of the second thin film transistor 2000 may be formed by the same patterning process. A layer where the first gate electrode 107 of the first thin film transistor and the second gate electrode 207 of the second thin film transistor are located is above the polysilicon active layer 50. However, the positional relationship between the layer where the first gate electrode 107 and the second gate electrode 207 are located and the polysilicon active layer 50 is not limited thereto. In other embodiments, the layer where the first gate electrode 107 and the second gate electrode 207 are located may be under the polysilicon active layer 50.

The array substrate provided by an embodiment of the present disclosure further includes a second buffer layer 302 capable of supplying oxygen. The second buffer layer 302 is located between the first buffer layer 301 and the metal oxide semiconductor active layer 40, and the first buffer layer 301 is located on a side of the second buffer layer 302 facing towards the polysilicon active layer 50.

As shown in FIG. 1, the first buffer layer 301 is located on the side of the second buffer layer 302 facing towards the interlayer dielectric layer 202, and the second buffer layer 302 is located on a side of the first buffer layer 301 away from the interlayer dielectric layer 202. The first buffer layer 301 is capable of blocking hydrogen, and is used to block the free hydrogen ions ($H^+$) in the interlayer dielectric layer 202 diffusing through the first buffer layer 301 to the metal oxide semiconductor active layer 40. The second buffer layer 302 may be an oxygen-rich insulating dielectric layer.

The first buffer layer 301 may be an aluminum oxide ($Al_2O_3$) layer, or a silicon nitride ($SiN_x$) layer, or an organic layer.

Since aluminum oxide ($Al_2O_3$), silicon nitride ($SiN_x$) and the organic layer all have good hydrogen blocking ability, the first buffer layer may be selected from aluminum oxide ($Al_2O_3$) or silicon nitride ($SiN_x$) having good hydrogen blocking ability, alternatively the first buffer layer 301 may be an organic layer. The first buffer layer 301 is deposited by chemical vapor deposition, physical deposition or sputtering. For example, the first buffer layer 301 is made of a silicon nitride ($SiN_x$) having a low hydrogen content, which may be formed by a reaction of silane ($SiH_4$) and nitrogen gas ($N_2$), and the hydrogen ($H^+$) content is about 10 at. % or less.

The hydrogen ($H^+$) content in the first buffer layer 301 is mainly measured by measuring a total content of S—H and N—H in a silicon nitride ($SiN_x$) film by spectroscopic analysis (abbreviated as FTIR). If the first buffer layer 301 is made of silicon nitride ($SiN_x$) with a low hydrogen content, the hydrogen content may be controlled at 10 at. % or less. If the first buffer layer 301 is made of aluminum oxide ($Al_2O_3$), the first buffer layer 301 is substantially free of hydrogen.

The second buffer layer 302 may be made of silicon oxide ($SiO_x$).

An oxygen content in the second buffer layer 302 is measured by spectral analysis (FTIR) on a silicon oxide ($SiO_x$) layer. A ratio of an absorption peak of the Si—O—Si co-axial stretching film (corresponding to a main absorption peak of Si—O) and an absorption peak of the reverse stretching film (corresponding to a shoulder absorption peak of Si—O) is calculated by analyzing intensities of Si—O absorption peaks and fitting them by Gaussian peak. Finally, the value of x in silicon oxide ($SiO_x$) is obtained by calculation. The x of high oxygen content silicon oxide ($SiO_x$) is between 1.6 and 2. The x of normal silicon oxide ($SiO_x$) is between 1.4 and 1.6, and the second buffer layer 302 can be made of high oxygen content silicon oxide ($SiO_x$).

On one hand, the second buffer layer 302 with a high oxygen content is capable of forming a dense oxide film to further block a passage of hydrogen, and on the other hand, it may supply oxygen to the metal oxide semiconductor active layer 40.

The oxygen content of the first buffer layer 301 is smaller than the oxygen content of the second buffer layer 302, and the hydrogen content of the first buffer layer 301 is greater than the hydrogen content of the second buffer layer 302.

The lead wires are used to connect the second source electrode 205 and/or the second drain electrode 206 of the second thin film transistor 2000 to the metal oxide semiconductor active layer 40 of the second thin film transistor. The material of the lead wire may the same as that of the metal oxide semiconductor active layer 40. Moreover, since the first buffer layer 301 has a higher hydrogen content than the second buffer layer 302, the first buffer layer 301 may provide a small amount of hydrogen ions to the lead wires in contact therewith, so that a contact resistance between the second source electrode 205 and/or the second drain electrode 206 of the second thin film transistor 2000 and the lead wires made of a metal oxide semiconductor material is greatly reduced.

As shown in FIG. 1, in an embodiment provided by the present disclosure, the array substrate further includes: a first gate electrode 107 of the first thin film transistor 1000 and a second gate electrode 207 of the second thin film transistor 2000 disposed on the gate insulating layer 201. The interlayer dielectric layer 202 covers the first gate electrode 107 and the second gate electrode 207.

The first source electrode 105 and the first drain electrode 106 of the first thin film transistor 1000 and the second source electrode 205 and the second drain electrode 206 of and the second thin film transistor 2000 are all located between the interlayer dielectric layer 202 and the first buffer layer 301.

The gate insulating layer 201 is formed on the polysilicon active layer 50. Specifically, the gate insulating layer 201 is formed by depositing silicon oxide ($SiO_x$) by chemical vapor deposition.

In an embodiment of the present disclosure, the first gate electrode 107 and the second gate 207 electrode are located in the same layer, and are both located on the gate insulating layer 201 and covered by the interlayer dielectric layer 202.

In the embodiment, the first gate electrode 107 of the first thin film transistor 1000 and the second gate electrode 207 of the second thin film transistor 2000 may be formed by the same patterning process, that is, the low-temperature polysilicon thin film transistor and the metal oxide thin film transistor share the gate electrode layer.

The first gate electrode 107 and the second gate electrode 207 are made of the same material by the same patterning process, thereby simplifying the manufacture process of the array substrate.

In an embodiment of the present disclosure, as shown in FIG. 1, the array substrate further includes a passivation layer 60 disposed on a side of the metal oxide semiconductor active layer 40 away from the base substrate 10, and the passivation layer 60 covers the metal oxide semiconductor active layer 40 and the second buffer layer 302 so as to protect the first thin film transistor 1000 and the second thin film transistor 2000.

Figure 2:
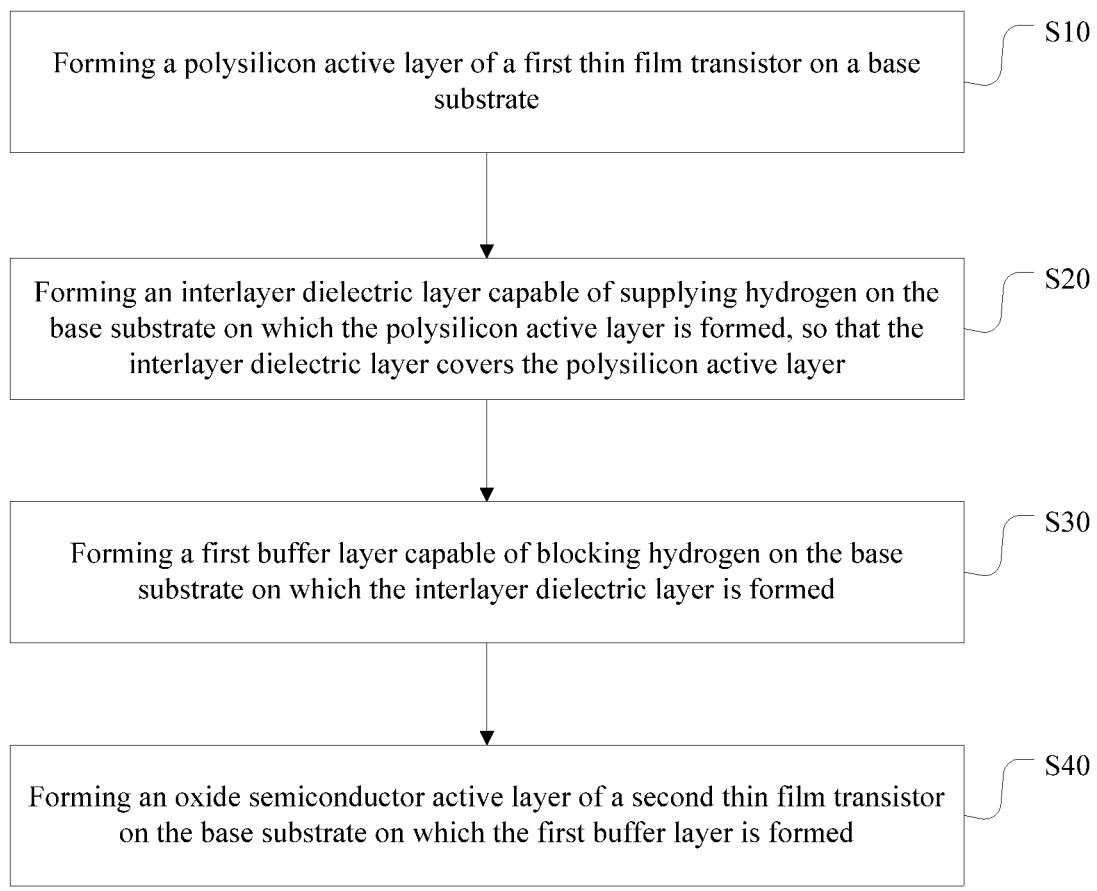
FIG. 2 is a schematic flow chart of a method of manufacturing an array substrate according to an embodiment of the present disclosure.

An embodiment of the present disclosure provides a method of manufacturing an array substrate. FIG. 2 is a schematic flow chart of the method, and the method includes the following steps:

S10: forming a polysilicon active layer of a first thin film transistor on a base substrate;

S20: forming an interlayer dielectric layer capable of supplying hydrogen on the base substrate on which the polysilicon active layer is formed, so that the interlayer dielectric layer covers the polysilicon active layer;

S30: forming a first buffer layer capable of blocking hydrogen on the base substrate on which the interlayer dielectric layer is formed; and S40: forming an oxide semiconductor active layer of a second thin film transistor on the base substrate on which the first buffer layer is formed.

Specifically, in step S10, a polysilicon material layer may be deposited on the base substrate 10 by any one of a chemical vapor deposition method, a physical deposition method and a sputtering method, and then the polysilicon material layer is patterned to form a pattern of the polysilicon active layer 50 by a patterning process.

The base substrate 10 is a plastic substrate or a glass substrate. In the embodiment, a plastic substrate may be used. The plastic substrate is flexible and easy to bend, and the cost is low.

The polysilicon material has good semiconductor properties and is connected to a first source electrode and a first drain electrode to be subsequently formed.

In step S20, the interlayer dielectric layer 202 is used to supply hydrogen ions for a hydrogenation treatment on the polysilicon active layer 50. The hydrogenation treatment utilizes abundant ions in the interlayer dielectric layer 202 to fill dangling bonds of silicon atoms in polysilicon so as to reduce quantity of unsteady dangling bonds and improve the stability of the polysilicon, thereby improving the electron mobility, conductivity characteristics and threshold voltage uniformity of a polysilicon semiconductor layer.

In an embodiment, before the step S20 of forming the interlayer dielectric layer capable of supplying hydrogen on the base substrate on which the polysilicon active layer is formed, the method of manufacturing the array substrate further includes:

S11: forming a gate insulating layer covering the polysilicon active layer on the base substrate on which the polysilicon active layer is formed; and S12: forming a first gate electrode of the first thin film transistor and a second gate electrode of the second thin film transistor on the gate insulating layer by one patterning process.

Specifically, the formed array substrate includes the gate insulating layer 201 disposed on the polysilicon active layer 50 and the interlayer dielectric layer 202 (abbreviated as ILD) disposed on the gate insulating layer 201 (abbreviated as GI), and the interlayer dielectric layer 202 has a function of supplying hydrogen.

In step S11, the gate insulating layer 201 is deposited on the polysilicon active layer 50 by chemical vapor deposition or physical deposition, and the gate insulating layer 201 may be made of silicon nitride ($SiO_x$).

In step S12, the first gate electrode 107 of the first thin film transistor 1000 and the second gate electrode 207 of the second thin film transistor 2000 are further formed on a side of the gate insulating layer 201 away from the base substrate 10. Specifically, a metal material is sputtered or deposited on a surface of the gate insulating layer 201 to form a metal layer, and the metal layer is patterned by a patterning process including photolithography, etching or the like to form the first gate electrode 107 and the second gate electrode 207. The gate insulating layer 201 is located between the first gate electrode 107 and the polysilicon active layer 50 of the first thin film transistor and isolates the first gate electrode 107 from the polysilicon active layer 50 to avoid a short circuit between the first gate electrode 107 and the polysilicon active layer 50.

Optionally, the first gate electrode 107 of the first thin film transistor 1000 and the second gate electrode 207 of the second thin film transistor 2000 are formed on the gate insulating layer 201 by one patterning process.

The first gate electrode 107 and the second gate electrode 207 are made of the same material by the same patterning process, thereby simplifying the manufacture process of the array substrate.

Further, in step S20, the interlayer dielectric layer 202 is deposited by chemical vapor deposition or physical deposition on the first gate electrode 107 and the second gate electrode 207. On one hand, the interlayer dielectric layer 202 is configured to isolate the first gate electrode 107 and the second gate electrode 207 from a first source electrode and a first drain electrode of the first thin film transistor and a second source electrode and a second drain electrode of the second thin film transistor to be subsequently formed on the interlayer dielectric layer 202. On the other hand, the interlayer dielectric layer 202 serves as a hydrogen supply layer to provide hydrogen ions for the subsequent hydrogenation process on the polysilicon active layer 50.

In an embodiment, before the step S30 of forming the first buffer layer capable of blocking hydrogen on the base substrate on which the interlayer dielectric layer is formed, the method of manufacturing the array substrate further includes:

S21: forming a first source electrode and a first drain electrode of the first thin film transistor and a second source electrode and a second drain electrode of the second thin film transistor on the interlayer dielectric layer by one patterning process.

Specifically, the first source electrode 105 and the first drain electrode 106 of the first thin film transistor 1000 may be electrically connected to the polysilicon active layer 50 through via holes formed in the gate insulating layer 201 and the interlayer insulating layer 202. In an embodiment, the first drain electrode 106 of the first thin film transistor 1000 and the second source electrode 205 of the second thin film transistor constitute a single unitary structure.

The first source electrode and the first drain electrode of the first thin film transistor and the second source electrode and the second drain electrode of the second thin film transistor are formed by the same patterning process, and the source electrodes and the drain electrodes of the two thin film transistors are made of the same material, thereby reducing the quantity of masks during the manufacture of the array substrate and simplifying the manufacture process.

The first drain electrode of the first thin film transistor is directly formed integrally with the second source electrode of the second thin film transistor, thereby saving the lead wire material and simplifying the manufacture process of the array substrate.

In an embodiment of the present disclosure, the first buffer layer 301 capable of blocking hydrogen is formed in step S30, and when the metal oxide semiconductor active layer is subsequently annealed, the free hydrogen ions ($H^+$) from the interlayer insulating layer 202 may be isolated by the first buffer layer 301 so as to avoid the metal oxide semiconductor active layer 40 becoming electrically conductive, thereby reducing the leakage current of the metal oxide thin film transistor and improving the display performance.

In step S30, the first buffer layer 301 is formed on the first source electrode 105 and the first drain electrode 106 of the first thin film transistor 1000 and the second source electrode 205 and the second drain electrode 206 of the second thin film transistor 2000. The first buffer layer 301 completely covers the source electrodes and the drain electrodes, and the first buffer layer 301 is made of aluminum oxide ($Al_2O_3$) or silicon nitride ($SiN_x$) having good hydrogen blocking capability, alternatively the first buffer layer 301 may be an organic layer. The first buffer layer 301 is formed by a deposition method, and the deposition method includes any one of chemical vapor deposition, physical deposition, and sputtering.

After the step S30 of forming the first buffer layer capable of blocking hydrogen on the base substrate on which the interlayer dielectric layer is formed, the method of manufacturing the array substrate further includes:

S31: forming a second buffer layer capable of supplying oxygen on the base substrate on which the first buffer layer is formed.

Specifically, in step S31, the second buffer layer 302 is formed on the first buffer layer 301, and the second buffer layer 302 may be made of silicon oxide ($SiO_x$). The second buffer layer 302 is also formed by a deposition method, and the deposition method is the same as the deposition method forming the first buffer layer 301, and will not be described again.

In step S40, a metal oxide material layer is formed on the second buffer layer 302 by one of chemical vapor deposition, physical deposition and sputtering, then the metal oxide material layer is patterned to form the metal oxide semiconductor active layer 40 by a patterning process.

With such a manufacturing method, it is possible to improve the process of forming the low-temperature polysilicon (LTPS) thin film transistor and the metal oxide thin film transistor on one substrate, and at least to solve the problem that the metal oxide becomes conductive caused by hydrogen ($H^+$) diffusion when the hydrogen is supplied to the polysilicon active layer 50.

In an embodiment, the method of manufacturing the array substrate further includes:

S41: performing a surface treatment on the second buffer layer with plasma to reduce dangling bonds.

Specifically, the plasma includes at least one of $N_2O$, $N_2$, and Ar. The plasma generated by ionization will directly fill the dangling bonds of the second buffer layer 302, thereby reducing the dangling bonds. Understandably, this step is not necessary.

In an embodiment, the method of manufacturing the array substrate may further include:

S42: forming a passivation layer covering the second buffer layer and the metal oxide semiconductor active layer.

This step may be performed after the step of performing the surface treatment on the second buffer layer with plasma.

Accordingly, the present disclosure also provides a display device including the array substrate described in any of the above embodiments of the present disclosure.

It should be noted that the display device provided by the present disclosure may be any product or component having an display function such as an electronic paper, an OLED panel, a display panel, a mobile phone, a tablet computer, a television, a display, a notebook computer, a digital photo frame, a navigator, and the like.

In summary, the present disclosure reduces the quantity of masks to a certain extent so as to simplify the process flow of the array substrate. The present disclosure discloses a structure in which the polysilicon active layer of the low-temperature polysilicon thin film transistor and the metal oxide semiconductor active layer of the metal oxide thin film transistor are placed on both sides of the first buffer layer having the function of hydrogen blocking. The structure may effectively solve the problem of short circuit of the metal oxide thin film transistor and improve the display performance of the display panel and the display device.

While some exemplary embodiments of the present disclosure have been shown in the foregoing, it will be understood by those skilled in the art that changes may be made to these exemplary embodiments without departing from the principles or spirit of the disclosure. The scope of the disclosure is defined by the claims and their equivalents.

What is claimed is:

1. An array substrate, comprising:
a base substrate;
a first thin film transistor and a second thin film transistor on the base substrate, wherein the first thin film transistor comprises a first active layer, the second thin film transistor comprises a second active layer, and the second active layer is on a side of the first active layer away from the base substrate; and
an interlayer dielectric layer and a first buffer layer between the first active layer and the second active layer, wherein the interlayer dielectric layer is capable of supplying hydrogen and the first buffer layer is capable of blocking hydrogen,
wherein the first thin film transistor comprises a first gate electrode, the second thin film transistor comprises a second gate electrode, and the first gate electrode and the second gate electrode are in the same layer and both between the first active layer and the interlayer dielectric layer.

2. The array substrate according to claim 1, wherein the first active layer is a polysilicon active layer, the second active layer is an oxide semiconductor active layer, and the first buffer layer is on a side of the interlayer dielectric layer away from the base substrate.

3. The array substrate according to claim 2, further comprising a second buffer layer capable of supplying oxygen, the second buffer layer being between the first buffer layer and the oxide semiconductor active layer.

4. The array substrate according to claim 1, wherein the first thin film transistor comprises a first source electrode and a first drain electrode, and the second thin film transistor comprises a second source electrode and a second drain electrode, one of the first source electrode and the first drain electrode is electrically connected to one of the second source electrode and the second drain electrode.

5. The array substrate according to claim 4, wherein the first source electrode, the first drain electrode, the second source electrode, and the second drain electrode are all in the same layer and between the interlayer dielectric layer and the first buffer layer.

6. The array substrate according to claim 5, wherein the one of the first source electrode and the first drain electrode and the one of the second source electrode and the second drain electrode constitute a single unitary electrode.

7. The array substrate according to claim 1, wherein material of the first buffer layer comprises aluminum oxide, silicon nitride or organic material.

8. The array substrate according to claim 3, wherein material of the second buffer layer comprises silicon oxide.

9. The array substrate according to claim 3, wherein the first buffer layer has an oxygen content smaller than that of the second buffer layer, and the first buffer layer has a hydrogen content greater than that of the second buffer layer.

10. The array substrate according to claim 2, further comprising a gate insulating layer between the polysilicon active layer and a gate electrode layer comprising the first gate electrode and the second gate electrode.

11. A display device comprising the array substrate according to claim 1.

* * * * *